United States Patent
Pearce et al.

[11] Patent Number: 5,576,144
[45] Date of Patent: *Nov. 19, 1996

[54] VINYL POLYMER BINDER FOR LASER ABLATIVE IMAGING

[75] Inventors: Glenn T. Pearce, Fairport; Richard P. Henzel, Webster, both of N.Y.

[73] Assignee: Eastman Kodak Company, Rochester, N.Y.

[*] Notice: The term of this patent shall not extend beyond the expiration date of Pat. No. 5,468,591.

[21] Appl. No.: 547,268

[22] Filed: Oct. 24, 1995

Related U.S. Application Data

[63] Continuation-in-part of Ser. No. 259,586, Jun. 14, 1994, Pat. No. 5,468,591.

[51] Int. Cl.$^6$ ............................................. G03C 5/16
[52] U.S. Cl. ..................... 430/270.15; 430/270.11; 430/945; 430/200; 430/201; 430/944; 430/964; 503/227; 428/195; 428/913; 428/914
[58] Field of Search ..................... 430/200, 201, 430/269, 270.11, 270.15, 945, 270.1, 944, 964; 425/195, 913, 914; 503/227

[56] References Cited

U.S. PATENT DOCUMENTS

| | | | |
|---|---|---|---|
| 3,964,389 | 6/1976 | Peterson | 430/200 |
| 4,062,827 | 12/1977 | Zollman | 524/718 |
| 4,405,750 | 9/1983 | Nakata et al. | 524/717 |
| 4,695,287 | 9/1987 | Evans et al. | 430/945 |
| 4,973,572 | 11/1990 | DeBoer | 503/227 |
| 5,256,506 | 10/1993 | Ellis et al. | 430/20 |
| 5,468,591 | 11/1995 | Pearce et al. | 430/200 |

*Primary Examiner*—Martin J. Angebrannat
*Attorney, Agent, or Firm*—Harold E. Cole

[57] ABSTRACT

An ablative recording element comprising a support having thereon a colorant layer comprising a colorant dispersed in a polymeric binder, the colorant layer having an infrared-absorbing material associated therewith, and wherein the polymeric binder comprises a vinyl polymer having recurring units of the following formula:

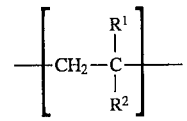

wherein:

$R^1$ and $R^2$ each independently represents a ketal group; an acetal group; a thioketal group; a thioacetal group; or an unsaturated group containing a double or triple bond between any two atoms, one of which is the atom of attachment to the polymer chain; or $R^1$ and $R^2$, as defined above, may be joined together to form a ring.

20 Claims, No Drawings

VINYL POLYMER BINDER FOR LASER ABLATIVE IMAGING

This application is a continuation-in-part of U.S. Ser. No. 08/259,586 of Pearce and Henzel, filed Jun. 14, 1994, now U.S. Pat. No. 5,468,591.

This invention relates to the use of a vinyl polymer binder in a laser ablative recording element.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off substantially all of the image dye and binder at the spot where the laser beam hits the element. In ablative imaging, the laser radiation causes rapid local changes in the imaging layer thereby causing the material to be ejected from the layer. Ablation imaging is distinguishable from other material transfer techniques in that some sort of chemical change (e.g., bond-breaking), rather than a completely physical change (e.g., melting, evaporation or sublimation), causes an almost complete transfer of the image dye rather than a partial transfer. The transmission Dmin density value serves as a measure of the completeness of image dye removal by the laser.

U.S. Pat. No. 4,973,572 relates to infrared-absorbing cyanine dyes used in laser-induced thermal dye transfer elements. In Example 3 of that patent, a positive image is obtained in the dye element by using an air stream to remove sublimed dye. However, the binder employed in this example is cellulose acetate propionate and not a vinyl binder.

U.S. Pat. No. 5,256,506 relates to an ablation-transfer image recording process. In that process, an element is employed which contains a dynamic release layer which absorbs imaging radiation which in turn is overcoated with an ablative carrier topcoat. An image is transferred to a separate receiver element in contiguous registration therewith. However, there is no disclosure in that patent of a single sheet process or that the binder for the ablative carrier topcoat is a vinyl polymer as described herein.

In general, the colorant layer of a donor element for thermal dye transfer is commonly prepared by application of a coating to a substrate. The coating may be an aqueous or solvent solution of materials or a suspension or dispersion of particles in an aqueous or organic solvent.

An important consideration for the coating of a colorant layer is its viscosity. A low solution viscosity is desirable and can be a significant advantage, since a higher concentration of materials can be coated without exceeding the viscosity requirements of the process. Another important consideration in the manufacturing process is the amount of organic solvent that is needed to make a film coating. For environmental considerations, it is desirable to use as little organic solvent as possible in the coating process.

It is an object of this invention to provide an ablative recording element in which the colorant layer can be prepared from a coating having a relatively low solution viscosity and with a minimum of organic solvent. It is another object of this invention to provide a single-sheet process which does not require a separate receiving element.

These and other objects are achieved in accordance with the invention which comprises an ablative recording element comprising a support having thereon a colorant layer comprising a colorant dispersed in a polymeric binder, the colorant layer having an infrared-absorbing material associated therewith, and wherein the polymeric binder comprises a vinyl polymer having recurring units of the following formula:

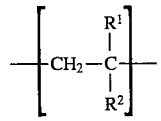

wherein:

$R^1$ and $R^2$ each independently represents a ketal group; an acetal group; a thioketal group; a thioacetal group; or an unsaturated group containing a double or triple bond between any two atoms, one of which is the atom of attachment to the polymer chain; such as cyano, carbonyl, isocyanate, azide, sulfonyl, nitro, phosphoric, phosphonyl, acetylenic, ethylenic, substituted or unsubstituted aryl or heteroaryl; or $R^1$ and $R^2$, as defined above, may be joined together to form a ring.

In a preferred embodiment of the invention, $R^1$ and $R^2$ each independently represents $-C(=X)R^3$ where X is O, S, NR, or $N^+(R)_2$; $R^3$ is R, OR, $O^-M^+$, OCOOR, SR, NHCOR, $NHCON(R)_2$, $N(R)_2$, $N^+(R)_3$, or $(N)_3$; $M^+$ is an alkali or ammonium moiety; and R is hydrogen, halogen, or a substituted or unsubstituted alkyl or cycloalkyl group; or X and $R^3$ may be joined together to form a ring.

In a preferred embodiment of the invention, the vinyl polymer has repeating units derived from alkyl cyanoacrylates or amides, or methylene diacrylates or diamides. In another preferred embodiment, the vinyl polymer is a poly(alkyl cyanoacrylate) such as poly(methyl cyanoacrylate), poly(ethyl cyanoacrylate), poly(propyl cyanoacrylate), poly(butyl cyanoacrylate), poly(ethylhexyl cyanoacrylate), or poly(methoxyethyl cyanoacrylate).

The molecular weights of the vinyl polymers described above may be between 1,000 and 1,000,000 weight average molecular weight. Particularly good results have been obtained with polymers having a molecular weight between 2,000 and 500,000 weight average (polystyrene equivalent by size exclusion chromatography).

The vinyl polymers described above may also be copolymerized with other monomers. For example, the vinyl polymer may comprise copolymers of at least 50 wt. %, preferably more than 75 wt. %, of repeating units as described above along with other vinyl monomers such as acrylates and methacrylates, acrylamides and methacrylamides, vinyl ethers, vinyl alkyl esters, maleic anhydrides, maleimides, itaconic acid and esters, fumaric acid and esters, etc.

Examples of vinyl polymers useful in the invention include the following:

$$\left[ CH_2 - \underset{\underset{R^2}{|}}{\overset{\overset{R^1}{|}}{C}} \right]$$

| Compound | $R^1$ | $R^2$ |
|---|---|---|
| 1 | $-C\equiv N$ | $-COOCH_3$ |
| 2 | $-C\equiv N$ | $-COOC_2H_5$ |
| 3 | $-C\equiv N$ | $-COOC_3H_7$ |
| 4 | $-C\equiv N$ | $-COOC_4H_9$ |
| 5 | $-C\equiv N$ | $-COOH$ |
| 6 | $-C\equiv N$ | $-C\equiv N$ |
| 7 | $-C\equiv N$ | $-COOCH_2CH(CH_2CH_3)C_4H_9$ |
| 8 | $-C\equiv N$ | $-COOCH_2CH_2OCH_3$ |
| 9 | $-C\equiv N$ | $-COOCH_2CH_2OCH_2CH_3$ |
| 10 | $-C\equiv N$ | $-CONHCH_3$ |
| 11 | $-C\equiv N$ | $-CON(CH_3)_2$ |
| 12 | $-COOCH_3$ | $-COOCH_3$ |
| 13 | $-CONHCH_3$ | $-CONHCH_3$ |
| 14 | $-C\equiv N$ | $(-COOCH_3)_{70}(-COOC_2H_5)_{30}$ |

Another embodiment of the invention relates to a single sheet process of forming a single color, ablation image in the absence of a receiving element comprising imagewise-heating by means of a laser, an ablative recording element as described above, the laser exposure taking place through the side of the support having thereon the colorant layer, and removing the ablated material, such as by means of an air stream, to obtain an image in the ablative recording element.

The vinyl polymer binder employed in the imaging layer of this invention can contain any type of colorant such as visible or infrared dyes, ultraviolet dyes, pigments, etc.

While any coverage of vinyl binder may be employed which is effective for the intended purpose, good results have been obtained at coverage's of from about 0.1 to about 5 g/m².

The ablation elements of this invention can be used to obtain medical images, reprographic masks, printing masks, etc. The image obtained can be a positive or a negative image.

The invention is especially useful in making reprographic masks which are used in publishing and in the generation of printed circuit boards. The masks are placed over a photosensitive material, such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials, the mask, which is used to block light during exposure, must absorb all wavelengths which activate the photosensitive material in the Dmax regions and absorb little in the Dmin regions. For printing plates, it is therefore important that the mask have high UV Dmax. If it does not do this, the printing plate would not be developable to give regions which take up ink and regions which do not.

The reduction in Dmin obtained with this invention is important for graphic arts applications where the Dmin/Dmax of the mask controls the exposure latitude for subsequent use. This also improves the neutrality of the Dmin for medical imaging applications. The dye removal process can be by either continuous (photographic-like) or halftone imaging methods.

To obtain a laser-induced, ablative image using the process of the invention, a diode laser is preferably employed since it offers substantial advantages in terms of its small size, low cost, stability, reliability, ruggedness, and ease of modulation. In practice, before any laser can be used to heat a ablative recording element, the element must contain an infrared-absorbing material, such as pigments like carbon black, or cyanine infrared-absorbing dyes as described in U.S. Pat. No. 4,973,572, or other materials as described in the following U.S. Pat. Nos.: 4,948,777, 4,950,640, 4,950,639, 4,948,776, 4,948,778, 4,942,141, 4,952,552, 5,036,040, and 4,912,083, the disclosures of which are hereby incorporated by reference. The laser radiation is then absorbed into the colorant layer and converted to heat by a molecular process known as internal conversion. Thus, the construction of a useful colorant layer will depend not only on the hue, transferability and intensity of the colorant, but also on the ability of the colorant layer to absorb the radiation and convert it to heat. The infrared-absorbing material or dye may be contained in the colorant layer itself or in a separate layer associated therewith, i.e., above or below the colorant layer. As noted above, the laser exposure in the process of the invention takes place through the colorant side of the ablative recording element, which enables this process to be a single-sheet process, i.e., a separate receiving element is not required.

Lasers which can be used in the invention are available commercially. There can be employed, for example, Laser Model SDL-2420-H2 from Spectra Diode Labs, or Laser Model SLD 304 V/W from Sony Corp.

Any dye can be used in the ablative recording element employed in the invention provided it can be ablated by the action of the laser. Especially good results have been obtained with dyes such as anthraquinone dyes, e.g., Sumikaron Violet RS® (product of Sumitomo Chemical Co., Ltd.), Dianix Fast Violet 3R-FS® (product of Mitsubishi Chemical Industries, Ltd.), and Kayalon Polyol Brilliant Blue N-BGM® and KST Black 146® (products of Nippon Kayaku Co., Ltd.); azo dyes such as Kayalon Polyol Brilliant Blue BM®, Kayalon Polyol Dark Blue 2BM®, and KST Black KR® (products of Nippon Kayaku Co., Ltd.), Sumikaron Diazo Black 5G® (product of Sumitomo Chemical Co., Ltd.), and Miktazol Black 5GH® (product of Mitsui Toatsu Chemicals, Inc.); direct dyes such as Direct Dark Green B® (product of Mitsubishi Chemical Industries, Ltd.) and Direct Brown M® and Direct Fast Black D® (products of Nippon Kayaku Co. Ltd.); acid dyes such as Kayanol Milling Cyanine 5R® (product of Nippon Kayaku Co. Ltd.); basic dyes such as Sumiacryl Blue 6G® (product of Sumitomo Chemical Co., Ltd.), and Aizen Malachite Green® (product of Hodogaya Chemical Co., Ltd.);

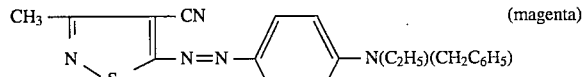 (magenta)

 (magenta)

 (yellow)

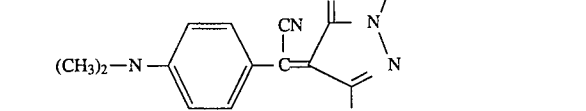 (yellow)

 (cyan)

 (cyan)

or any of the dyes disclosed in U.S. Pat. Nos. 4,541,830, 4,698,651, 4,695,287, 4,701,439, 4,757,046, 4,743,582, 4,769,360, and 4,753,922, the disclosures of which are hereby incorporated by reference. The above dyes may be employed singly or in combination. The dyes may be used at a coverage of from about 0.05 to about 1 g/m² and are preferably hydrophobic.

Pigments which may be used in the colorant layer of the ablative recording layer of the invention include carbon black, graphite, metal phthalocyanines, etc. When a pigment is used in the colorant layer, it may also function as the infrared-absorbing material, so that a separate infrared-absorbing material does not have to be used.

The colorant layer of the ablative recording element employed in the invention may be coated on the support or printed thereon by a printing technique such as a gravure process.

Any material can be used as the support for the ablative recording element employed in the invention provided it is dimensionally stable and can withstand the heat of the laser. Such materials include polyesters such as poly(ethylene naphthalate); poly(ethylene terephthalate); polyamides; polycarbonates; cellulose esters such as cellulose acetate; fluorine polymers such as poly(vinylidene fluoride) or poly-(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 mm. In a preferred embodiment, the support is transparent.

The following example is provided to illustrate the invention.

EXAMPLE

The following dyes have been used in the experimental work described below.

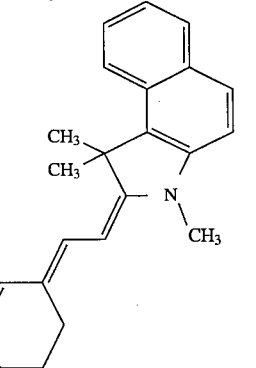 IR-Dye Infrared-Absorbing Dye

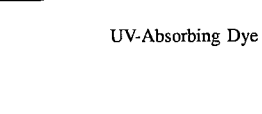 UV-Absorbing Dye

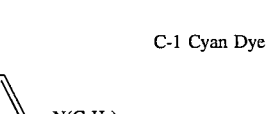 C-1 Cyan Dye

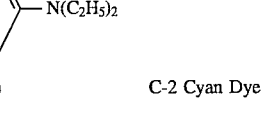 C-2 Cyan Dye

 Y-1 Yellow Dye

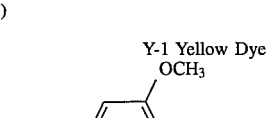 Y-2 Yellow Dye

Polymerization Procedures

The cyanoacrylate monomers from which the binder polymers tested were made were purchased commercially or prepared as described in the published literature (Y. C. Tseng, et al., Biomaterials 1990, 11, 73–79; F. B. Joyner, et al., U.S. Pat. No. 2,765,251 (1956)).

Polymers from these monomers were prepared, following one of three procedures, namely anionic solution polymerization (Procedure A); free radical solution polymerization (Procedure B); or free radical bulk polymerization (Procedure C).

Procedure A

A typical solution of 20 wt-% cyanoacrylate monomer (25 g) in ethyl acetate was treated with 2 μl triethylamine at 25° C. under nitrogen with mechanical stirring for 24 hr. The polymer, precipitated on addition of methanol or heptane, was subsequently collected and dried in a vacuum oven. Yields ranged from 80–90%.

Procedure B

To a solution of 50% cyanoacrylate monomer (and optionally comonomer) in 2-butanone were added 5 wt-% acetic acid and 0.25–2.0 wt-% azoisobutylonitrile (AIBN). The resulting mixture was held under nitrogen at 65° C. for 8–16 hr, and the polymer was precipitated into methanol, collected and dried in a vacuum oven. Yields ranged from 80–90%.

Procedure C

To cyanoacrylate monomer were added 6.1 wt-% acetic acid and 0.75 wt-% AIBN. The resulting mixture was heated to 65° C. and kept under nitrogen for 6–8 hr, at which point solid polymer had formed in the reactor. The polymer was dissolved in a suitable solvent, precipitated into methanol, collected and dried in a vacuum oven. Yields ranged from 80–90%.

Solution viscosity measurements were made on the polycyanoacrylates by dissolving 0.699 g of polymer in 17.987 g of solvent, as indicated in Table 1 below. Measurements were taken at room temperature with a Brookfield viscometer and reported in centipoise (cp).

TABLE 1

Solution Viscosity Measurements (in cp)

| Polymer | Mw | In 2-butanone | In N-methyl-pyrrolidinone |
|---|---|---|---|
| Poly(ethyl cyanoacrylate) | 69,000 | 0.67 | 4.06 |
| Poly(2-methoxyethyl cyanoacrylate) | 233,000 | 0.70 | 2.46 |
| Poly(n-butyl cyanoacrylate) | 180,000 | — | 2.98 |
| Cellulose nitrate (control) | 689,000 | 1450 | 2740 |

Laser Dye Ablation Coatings and Measurements

Coatings for laser dye ablation were prepared dissolving the binder polymer to be tested in solvent by stirring at 25° C. overnight. The dyes were added and stirred until dissolved while protecting the solution from light. The resulting mixture was filtered through 1 μm porosity glass filters before use. Two different formulations were used, designated as Formula A and Formula B, respectively.

| COMPONENT | grams |
|---|---|
| Formula A: | |
| Binder Polymer | 3.493 |
| IR-dye | 1.245 |
| UV-dye | 0.753 |
| Y-1 | 1.581 |
| C-1 | 0.934 |
| 2-butanone | 82.795 |
| ethanol | 9.119 |
| Formula B: | |
| Binder Polymer | 1.436 |
| IR-dye | 0.358 |
| Y-2 | 0.680 |
| Y-1 | 0.227 |
| C-2 | 0.627 |
| methyl isobutyl ketone | 37.338 |
| ethanol | 9.334 |

These formulations were coated using a semiautomatic syringe-fed coating machine at 1.39 g/m$^2$ for Formula A and 1.75 g/m$^2$ for Formula B. The substrate was poly(ethylene terephthalate) sheet stock, which had been precoated with a cyanoacrylate barrier polymer (see the above co-pending patent application).

Laser dye ablation data were obtained with the test samples as prepared above by irradiating the samples using focussed 830 nm laser light to ablate the dyes. Results are reported as residual optical density in the ultraviolet region for a given laser energy applied per unit area. An X-Rite Model 361T Densitometer (X-Rite Corp., Grandville, Mich.) was used to determine the optical densities.

Printing

Samples of the above examples were ablation written using a laser diode print head, where each laser beam has a wavelength range of 830–840 nm and a nominal power output of 550 mW at the film plane.

The drum, 53 cm in circumference, was rotated at varying speeds and the imaging electronics were activated to provide adequate exposure. The translation stage was incrementally advanced across the dye ablation element by means of a lead screw turned by a microstepping motor, to give a center-to-center line distance of 10.58 mm (945 lines per centimeter or 2400 lines per inch). An air stream was blown over the dye ablation element surface to remove the ablated dye. The ablated dye and other effluents are collected by suction. The measured total power at the focal plane was 550 mW per channel maximum.

The experimental data are summarized in Table 2 below. The energy values shown there in mJ/cm$^2$ were derived from the actual drum revolutions (rev/min) of the exposure equipment.

TABLE 2

Ablation Energy and Optical Density Data

| Formula | Binder Polymer | Energy Applied mJ/cm$^2$ | Optical Density |
|---|---|---|---|
| A | nitrocellulose (control) | 1004 | 0.0872 |
| | | 893 | 0.0807 |
| | | 803 | 0.0795 |
| | | 730 | 0.0811 |

TABLE 2-continued

Ablation Energy and Optical Density Data

| Formula | Binder Polymer | Energy Applied mJ/cm² | Optical Density |
|---|---|---|---|
| | | 669 | 0.0908 |
| | | 618 | 0.0973 |
| | | 0 | 5.5659 (Dmax) |
| B | nitrocellulose (control) | 1004 | 0.0849 |
| | | 893 | 0.0834 |
| | | 803 | 0.0866 |
| | | 730 | 0.0986 |
| | | 669 | 0.1308 |
| | | 618 | 0.1915 |
| | | 0 | 5.6719 (Dmax) |
| A | poly(2-ethylhexyl cyanoacrylate) | 1004 | 0.1920 |
| | | 893 | 0.1505 |
| | | 803 | 0.1011 |
| | | 730 | 0.0944 |
| | | 669 | 0.0956 |
| | | 618 | 0.1065 |
| | | 0 | 3.0341 (Dmax) |
| B | poly(2-ethylhexyl cyanoacrylate) | 1004 | 0.1059 |
| | | 893 | 0.0987 |
| | | 803 | 0.095 |
| | | 669 | 0.1026 |
| | | 618 | 0.1759 |
| | | 0 | 2.8471 (Dmax) |
| A | poly(n-butyl cyanoacrylate) | 1004 | 0.1673 |
| | | 893 | 0.1153 |
| | | 803 | 0.0957 |
| | | 730 | 0.0916 |
| | | 669 | 0.0928 |
| | | 618 | 0.1022 |
| | | 0 | 3.3388 (Dmax) |
| B | poly(n-butyl cyanoacrylate) | 1004 | 0.0992 |
| | | 893 | 0.0939 |
| | | 803 | 0.0906 |
| | | 730 | 0.0916 |
| | | 669 | 0.0928 |
| | | 618 | 0.1022 |
| | | 0 | 3.1512 (Dmax) |
| A | poly(2-methoxyethyl cyanoacrylate) | 1004 | 0.1023 |
| | | 893 | 0.0974 |
| | | 803 | 0.0906 |
| | | 730 | 0.0887 |
| | | 669 | 0.0972 |
| | | 618 | 0.1908 |
| | | 0 | 3.226 (Dmax) |
| B | poly(2-methoxyethyl cyanoacrylate) | 1004 | 0.0964 |
| | | 893 | 0.0955 |
| | | 803 | 0.0923 |
| | | 730 | 0.0925 |
| | | 669 | 0.0998 |
| | | 618 | 0.1552 |
| | | 0 | 3.2171 (Dmax) |
| A | poly(ethyl cyanoacrylate) | 1004 | 0.1051 |
| | | 893 | 0.0952 |
| | | 803 | 0.0877 |
| | | 730 | 0.0874 |
| | | 669 | 0.0878 |
| | | 618 | 0.0997 |
| | | 0 | 3.7773 (Dmax) |
| B | poly(ethyl cyanoacrylate) | 1004 | 0.0954 |
| | | 893 | 0.0906 |
| | | 803 | 0.0880 |
| | | 730 | 0.0904 |
| | | 669 | 0.1000 |
| | | 618 | 0.1532 |
| | | 0 | 3.1486 (Dmax) |
| A | poly(2-methoxyethyl cyanoacrylate-co-n-butyl methacrylate) (80:20) | 1004 | 0.1056 |
| | | 893 | 0.1074 |
| | | 803 | 0.1114 |
| | | 730 | 0.1179 |
| | | 669 | 0.1398 |
| | | 618 | 0.2813 |
| | | 0 | 3.4992 (Dmax) |
| B | poly(2-methoxyethyl cyanoacrylate-co-n-butyl-methacrylate) (80:20) | 1004 | 0.1338 |
| | | 893 | 0.1367 |
| | | 803 | 0.1451 |
| | | 730 | 0.1651 |
| | | 669 | 0.2442 |
| | | 618 | 0.3848 |
| | | 574 | 0.9555 |
| | | 0 | 3.4482 (Dmax) |

The above results show that polycyanoacrylates as binders for the recording layer of laser ablative recording elements clean out approximately as fast as conventionally used nitrocellulose. However, the binder polymers of the invention provide the advantage of significantly lower solution viscosities and thereby make it possible to achieve higher percent solids content in the coating solutions.

The invention has been described in detail with particular reference to preferred embodiments thereof, but it will be understood that variations and modifications can be effected within the spirit and scope of the invention.

What is claimed is:

1. An ablative recording element comprising a support having thereon a colorant layer comprising a colorant dispersed in a polymeric binder, said colorant layer having an infrared-absorbing material associated therewith, and wherein said polymeric binder comprises a vinyl polymer having recurring units of the following formula:

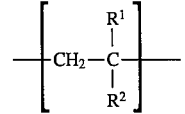

wherein:

$R^1$ and $R^2$ each independently represents a ketal group; an acetal group; a thioketal group; a thioacetal group; or an unsaturated group containing a double or triple bond between any two atoms, one of which is the atom of attachment to the polymer chain; or $R^1$ and $R^2$, as defined above, may be joined together to form a ring, wherein at least one of said colorant and said infrared-absorbing material is a pigment.

2. The element of claim 1 wherein said $R^1$ and $R^2$ each independently represents $-C(=X)R^3$ where X is O, S, NR, or $N^+(R)_2$; $R^3$ is R, OR, $O^-M^+$, OCOOR, SR, NHCOR, NHCON(R)$_2$, N(R)$_2$, $N^+(R)_3$, or (N)$_3$; $M^+$ is an alkali or ammonium moiety; and R is hydrogen, halogen, or a substituted or unsubstituted alkyl or cycloalkyl group; or X and $R^3$ may be joined together to form a ring.

3. The element of claim 1 wherein said vinyl polymer is a poly(alkyl cyanoacrylate).

4. The element of claim 3 wherein said poly(alkyl cyanoacrylate) is poly(methyl cyanoacrylate) or poly(ethyl cyanoacrylate).

5. The element of claim 1 wherein said vinyl polymer is present at a concentration of from about 0.1 to about 5 g/m².

6. The element of claim 1 wherein a barrier layer is present between said support and said colorant layer.

7. The element of claim 1 wherein said infrared-absorbing material is a dye which is contained in said colorant layer.

8. The element of claim 1 wherein said support is transparent.

9. The element of claim 1 wherein said colorant is a dye.

10. The element of claim 1 wherein said colorant is a pigment which also functions as said infrared-absorbing material.

11. A single sheet process of forming a single color, ablation image in the absence of a receiving element comprising imagewise-heating by means of a laser, an ablative recording element comprising a support having thereon a colorant layer comprising a colorant dispersed in a polymeric binder, said colorant layer having an infrared-absorbing material associated therewith, said laser exposure taking place through the side of said support having thereon said colorant layer, and removing the ablated colorant to obtain said image in said ablative recording element, wherein said polymeric binder comprises a vinyl polymer having recurring units of the following formula:

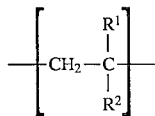

wherein:

$R^1$ and $R^2$ each independently represents a ketal group; an acetal group; a thioketal group; a thioacetal group; or an unsaturated group containing a double or triple bond between any two atoms, one of which is the atom of attachment to the polymer chain; or $R^1$ and $R^2$, as defined above, may be joined together to form a ring.

12. The process of claim 11 wherein said $R^1$ and $R^2$ each independently represents $-C(=X)R^3$ where X is O, S, NR, or $N^+(R)_2$; $R^3$ is R, OR, $O^-M^+$, OCOOR, SR, NHCOR, $NHCON(R)_2$, $N(R)_2$, $N+(R)_3$, or $(N)_3$; $M^+$ is an alkali or ammonium moiety; and R is hydrogen, halogen, or a substituted or unsubstituted alkyl or cycloalkyl group; or X and $R^3$ may be joined together to form a ring.

13. The process of claim 11 wherein said vinyl polymer is a poly(alkyl cyanoacrylate).

14. The process of claim 13 wherein said poly(alkyl cyanoacrylate) is poly(methyl cyanoacrylate) or poly(ethyl cyanoacrylate).

15. The process of claim 11 wherein said vinyl binder is present at a concentration of from about 0.1 to about 5 g/m².

16. The process of claim 11 wherein a barrier layer is present between said support and said colorant layer.

17. The process of claim 11 wherein said infrared-absorbing material is a dye which is contained in said colorant layer.

18. The process of claim 11 wherein said support is transparent.

19. The process of claim 11 wherein said colorant is a dye.

20. The process of claim 11 wherein said colorant is a pigment which also functions as said infrared-absorbing material.

* * * * *